WAVE FREQUENCY MULTIPLIER EMPLOYING A NONLINEAR DEVICE IN A BAND-PASS FILTER

Filed Dec. 30, 1966

Fredérick P. Collins
Roland Everett Clark
Inventors
by Alfred H. Rosen
Attorney

Fredêrick P. Collins
Roland Everett Clark
Inventors
by Alfred H. Rosen
Attorney

United States Patent Office 3,443,199

Patented May 6, 1969

3,443,199

WAVE FREQUENCY MULTIPLIER EMPLOYING A NONLINEAR DEVICE IN A BAND-PASS FILTER

Fredrick P. Collins, Carlisle, and Roland Everett Clark, West Acton, Mass., assignors to Microwave Associates, Inc., Burlington, Mass., a corporation of Massachusetts Filed Dec. 30, 1966, Ser. No. 606,410
Int. Cl. H02m 5/16
U.S. Cl. 321—69 13 Claims

ABSTRACT OF THE DISCLOSURE

An electric wave frequency multiplier having a band-pass filter of the comb-line or interdigital type in which the input post has a varactor in series and is tuned to the output frequency. The input frequency is coupled to the input post over an input circiuit in series with the input post and varactor which is tuned to the input frequency. The band-pass of the filter includes the output frequency but rejects adjacent harmonics.

*Background of the invention*

This invention relates in general to electric wave frequency changing circuits, and in particular to solid state harmonic generator circuits.

In the continuing effort to replace electron tube oscillators as signal and power sources at microwave freauencies, solid state generators of higher-order harmonics of an input frequency have been found to be useful. However, while multiplication factors approaching 10 can be achieved in a single multiplier stage, the best results have thus far being obtained with frequency doublers, triplers and quadruplers. For higher-order multiplication it has up to now been usual to resort to plural-stage multiplier chains to achieve the desired output frequency, and this has the disadvantages of increased cost and complexity, as well as imposing undesirable limits on the bandwidth of the system. Moreover several of the prior art approaches involve the use of an idler circuit for the circulation of unwanted harmonic currents, which is wasteful and introduces the requirement of tuning a circuit which has no useful function.

*Description of the invention*

It is the object of the present invention to provide solid state generators of higher-order harmonics of an input microwave frequency wave which will efficiently generate harmonics of the tenth and higher orders of the input frequency in a single stage with improved bandwidth and output signal purity.

Another object is to employ a band-pass filter, tuned to pass a band including the desired harmonoic frequency and to reject adjacent order harmonic frequencies, having an input coupling circuit tuned to the desired harmonic frequency and forming part of a signal input circuit tuned to the desired input frequency, with a voltage-variable nonlinear impedance device coupled in common to both circuits.

A further object is to provide an improved high-order frequency multiplier which does not require the use of idler circuits.

According to the invention in one of its general aspects, there is provided an electric wave frequency changer for providing in the presence of an input wave at a frequency $f_i$ an output wave at a different frequency $f_o$ comprising a band-pass filter having in a single structure input coupling means followed by a plurality of intercoupled resonators and output coupling means, the pass-band of said filter including $f_o$ but not $f_i$, a voltage-variable nonlinear impedance device coupled to said input coupling means within said structure, means to tune said input coupling means to resonance at the frequency $f_o$ of said output wave, an input circuit providing a wave path and means for tuning said path substantially to resonance at the frequency $f_i$ of said input wave, said wave path being partially outside said structure and including said input coupling means so that the input frequency $f_i$ is applied to said device.

In another aspect, the invention provides an electric wave frequency multiplier for providing in response to an input wave at a frequency $f_i$ an output wave at a frequency $f_o$ which is $nf_i$ where "$n$" is an integer, comprising in a single structure a band-pass filter the pass-band of which includes $f_o$ and substantially excludes $(n+1)f_i$ and $(n-1)f_i$, a voltage-variable impedance device for generating harmonics of a wave impressed upon it, an input circuit providing a wave path of said input wave and means for tuning said path substantially to resonance at $f_i$, said device coupled to said path in a region substantially adjacent one end thereof, and means spaced along said path from said end for tuning a portion of the said path including said region substantially to resonance at $f_o$, said portion being contained within said structure and constituting an input coupling means for said filter.

The invention will be explained in greater detail in the following description of exemplary embodiments. This description refers to the accompanying drawings, in which.

Figure 1:
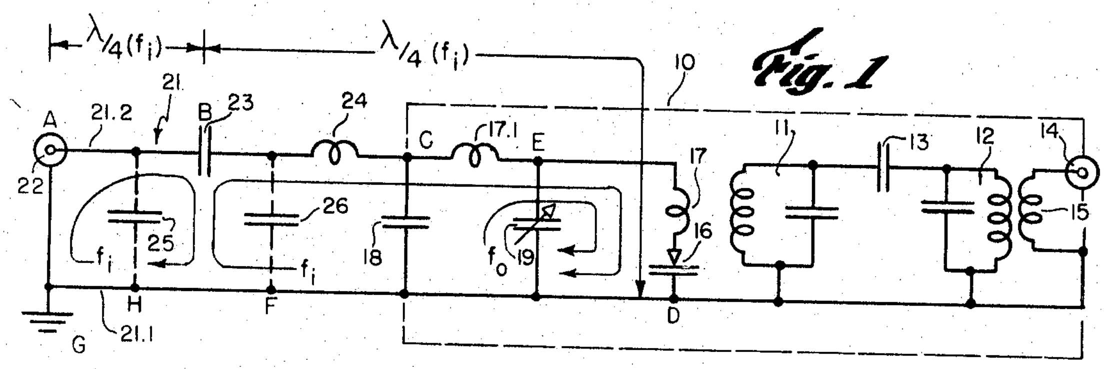
FIG. 1 is a schematic circuit for explaining the invention.

An electric wave band-pass filter having a multiplicity of coupled resonators in tandem is contained in an enclosure represented by the dashed-line box 10. Interdigital and comb-line filters are exemplary. Suitable band-pass filters are described in "Microwave Filters, Impedance-Matching Networks and Coupling Structures" (pages 421–650), Young, Matthaei, and Jones, McGraw-Hill Book Co.

In the enclosure 10, tuned circuits 11 and 12 represent a multiplicity of coupled resonators in tandem. In this example they are coupled by a capacitor 13. Output coupling means comprises an output terminal connector 14 and an inductor 15 coupled to the last resonator 12. The input coupling means for the filter is connected between input point C and ground at point D, and includes a nonlinear voltage variable capacitance semiconductor diode 16 (i.e., a varactor or "snap diode") connected between points C and D within the box 10 in series with the inductance of the coupling means represented by inductors 17 and 17.1 in series. The first resonator 11 of the filter is coupled inductively to the input coupling means through a portion 17 of this inductance. A bypass capacitor 18 providing low impedance for the harmonic, or output, frequency $f_o$ is connected between points C and D. The Capacitance of capacitor 18 is preferably of the same order of magnitude as that of the diode 16. A variable trimming capacitor 19, for tuning the input means to the output frequency is connected between an intermediate point E on the input coupling means and ground point D.

An input circuit for the input frequency $f_i$ includes a transmission line section 21 between an input terminal connector 22 at point A and the filter at points C and D. One side 21.1 of the line is grounded at G. A capacitor 23 is located at point B in the other side 21.2 of the line section. The distributed inductance of the line is represented by a lumped inductor 24 shown in series with the capacitor 23 between points B and C. The distributed capacitance of the line is represented by lumped capacitors 25 and 26, one on either side of point B.

The complete input circuit includes the wave path between points A and C and in series therewith the wave path between points C and D which comprises the inductors 17, 17.1 and diode 16 in series. The entire wave path between points A and D is tuned to resonance at the input frequency. A suitable relationship is $\lambda/2$ for $f_i$ from point A to point D, with the capacitor B located at a distance $\lambda/4$ ($f_i$) from point A and from point D, as shown in FIG. 1. The input terminal connector 22 can then be located at point A, as shown, or at a point along the input wave path nearer to point B, for example a point where the impedance is 50 ohms or higher, depending upon the input impedance desired. As is clearly shown, the wave path for the input frequency $f_i$ is partially outside the enclosure 10 and includes in series the varactor and inductance of the input coupling means 16, 17, 17.1 located within the enclosure between points C and D.

Figure 1A:
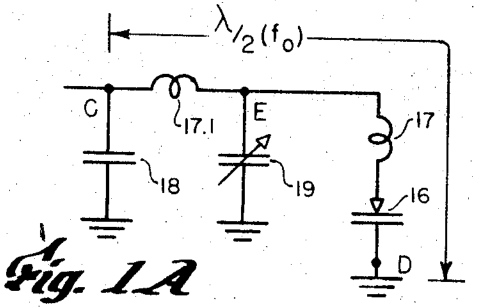
FIG. 1A is a part of FIG. 1 for explaining a feature of the invention.
Figure 1B:
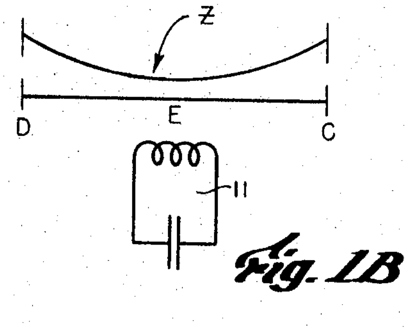
FIG. 1B is a sketch for explaining a detail of FIG. 1.

The filter input coupling means between points C and D is tuned to resonance at the output frequency $f_o$ of the desired harmonic of those generated in the varactor 16. This may be half-wave resonance to $f_o$, as shown in FIG. 1A, with the connection point E of the trimming capacitor 19 located about $\lambda/4$ ($f_o$) from either point C or D. With this arrangement, the impedance (at $f_o$) will be lower at point E than at points C and D, as is indicated in FIG. 1B, where the curve labelled Z represents relative impedance values, and the first resonator 11 is coupled at the region of minimum impedance.

Figure 6:
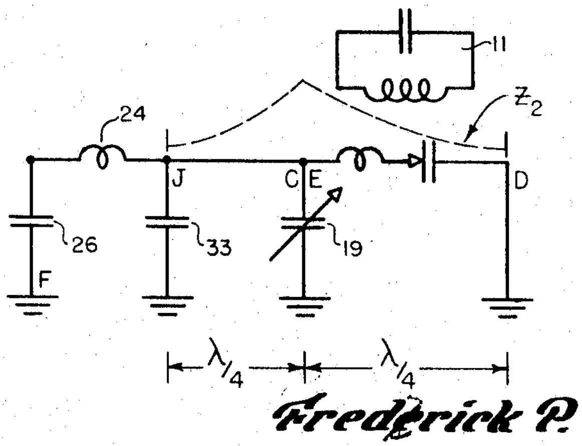
FIG. 6 is a partial schematic circuit showing another embodiment of the invention.

Alternatively, the input filter coupling path between points C and D can be tuned to quarter-wave resonance at the output frequency $f_o$, as is shown in FIG. 6. In this case point E will essentially coincide with point C and the impedance at point C will be somewhat higher than the impedance at point D. For example, if the impedance at the diode 16 is 2 to 5 ohms the impedance at point C will be not less than 5 ohms, but may in practice be nearer to 10 ohms.

Figure 2:
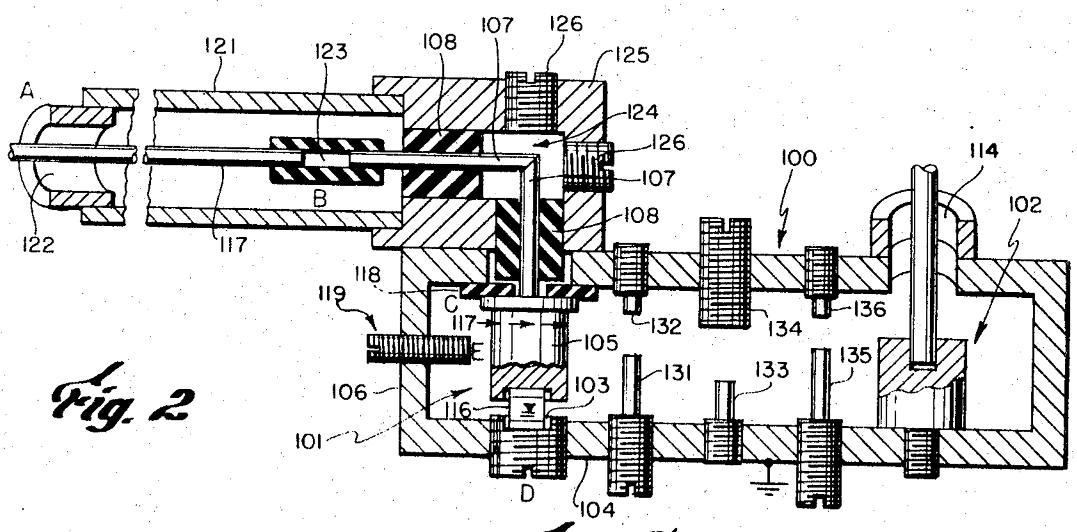
FIG. 2 is a longitudinal section through a simplified illustration of an embodiment of the invention.

FIG. 2 is a longitudinal section through a simplified illustration of a practical embodiment of the invention. The box 100 is the enclosure of a comb-line filter having an input post 101 and an output post 102. The input post extends between point C and point D, corresponding to similar points on FIG. 1, and includes a threaded member 103 engaged in the lower wall 104 of the housing 100 and a second opposing member 105. The semiconductor diode 116 is held between these two members. The second member 105 of the input post is connected to a first section of inner conductor 107 of a coaxial line which is insulated from the housing 100, and is bypassed to ground (namely the wall of the housing 100) through a capacitor having as its dielectric an annular member 118 located between the second input post member 105 and the housing 100. A stub post 119 engaged in a side wall 106 of the housing 100 can be adjusted to and from the input post 101 and functions as a tuning capacitor corresponding to the trimming capacitor 19 in FIG. 1. Point E is illustrated in FIG. 2 as adjacent the semiconductor diode 116 but, depending on the location of the stub post 119, point E may be made to coincide substantially with point C, if desired.

The input wave structure comprises an electrically conductive sleeve 121 surrounding a second section of inner conductor 117, which is capacitively conducted to the first section 107 through a sleeve 123 of dielectric material, such as "Teflon" (trademark for a tetrafluoroethylene resin). This capacitive coupling corresponds to the capacitor 23 at point B in FIG. 1. An input connector 122 is furnished at one end of the sleeve 121, and this connector corresponds to the connector 22 at point A in FIG. 1.

The sleeve 121 is fitted into an input coupling housing 125 holding two portions of the first inner conductor 107 at a right angle relationship in dielectric sleeves 108. Plugs 126 are provided in the housing 125 to enable the two parts of inner conductor 107 to be fastened together, as by soldering. The distributed inductance of the inner conductors 107 and 117, represented by the lumped inductor 24 in FIG. 1, is generally indicated by the reference character 124 in FIG. 2.

The comb-line filter, as is well known, has an input post 101 and an output post 102 which normally are non-resonant and are adjusted to match input and output impedance, respectively (that is, they are essentially impedance transformers). In the present invention, however, the inpupt post 101 is tuned to the output frequency, and is part of the wave path for the input frequency. The intermediate posts 131, 132; 133, 134; and 135, 136 constitute a multiplicity of coupled resonators, the construction and function of which are well known in the art. As is shown in FIG. 2, post members 132, 133 and 136 are normally fixed in position in the walls of the enclosure 100, while post members 131, 134 and 135, respectively, are normally adjustable. An output terminal 114, corresponding to terminal 14 in FIG. 1, is coupled to the output post 102.

The inductance 17, 17.1 in FIG. 1 finds its equivalent in the inductance 117 distributed around the outside of the second input post element 105 in FIG. 2, represented by the series of arrows around that element. The magnitude of the inductance 117 can be increased by reducing the diameter of this post element 105, and vice versa. Obviously, since the diode 116 has one electrode (at the second post element 105) isolated from ground, the diode can be D.C. biased as desired. The output post 102 remains untuned.

The invention functions as a frequency multiplier with no idler-frequency circuit present. Frequency multipliers according to the invention substantially as illustrated in FIG. 2 have been built as doublers, triplers and so on up to 14× multipliers, up to the present time. For higher-order multipliers, implying a high-frequency $f_o$, the input post element 105 is made thicker to reduce its inductance, thereby raising the resonant frequency of the input coupling means post 101 incorporating the nonlinear device 116. The bandwidth of the multiplier is determined by the Q of the input circuit and the bandwidth of the filter. A 3× multiplier, having $f_i=2$ gc. and $f_o=6$ gc. has been built having 15% bandwidth. A similar multiplier was tested with $f_o=1$ gc. and, by appropriate tuning of the input coupling means was made to function as an 8×, 9× or 10× multiplier, as desired. At each range, for input power =400 milliwatts, output power (at 8 gc., 9 gs. or 10 gc.) was greater than 40 mw., and spurious attenuation was >55 db; that is, when $f_o$ was 10 gc., then output energy at 9 gc. or 11 gc. was >55 db down from the energy level at 10 gc. The bandwidth was 200 mc./sec. at the output frequency (measured 1 db down).

Figure 3:
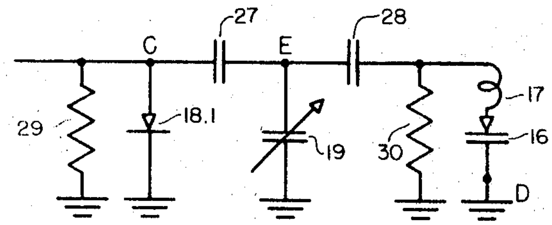
FIG. 3 is a partial schematic circuit showing a modification of FIG. 1.

Referring to FIG. 3, the bypass capacitor 18 can be replaced by a diode 18.1. In that event, isolating capacitors 27 and 28 are provided in the signal path between points C and E and between points E and D, respectively, and resistors 29 and 30 are provided in shunt with each diode 18.1 and 16, respectively, so that each diode is D.C. isolated. This arrangement permits higher power levels to be handled in the multiplier.

Figure 4:
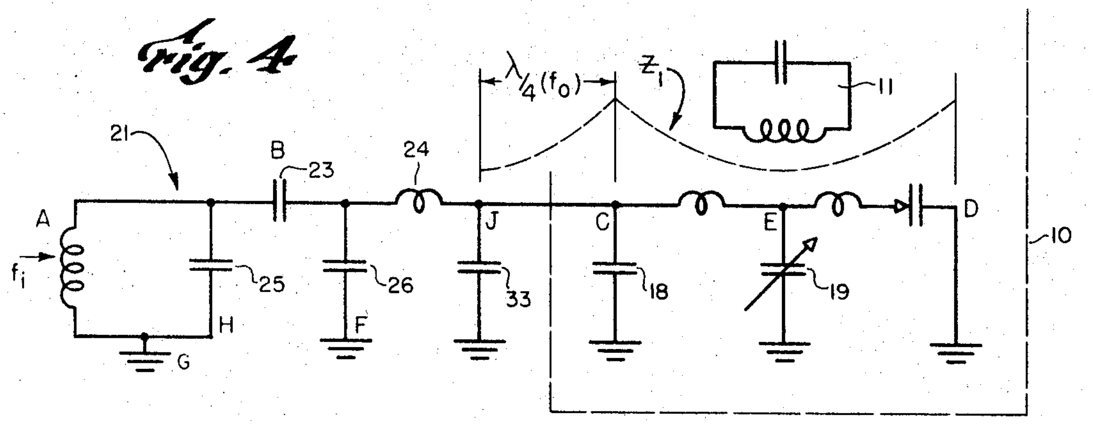
FIG. 4 is a schematic circuit of another embodiment of the invention.

To provide additional decoupling of the output frequency $f_o$ signal from the input circuit, an additional capacitor 33, shown in FIG. 4, is shunted across the input transmission line 21 at a point J between points B and C located $\lambda/4$ from point C for $f_o$, for shunting output frequency $f_o$ energy to ground at point J. The relative impedance values are represented by the dashed-line curve $Z_1$ indicating that the impedance at $f_o$ is lower at point J than at point C. As is also indicated in FIG. 1, sections A–H and D–F of the input signal path are each resonant ($\lambda/4$) at the input frequency, and they are coupled by the capacitor 23 at point B.

Figure 5:
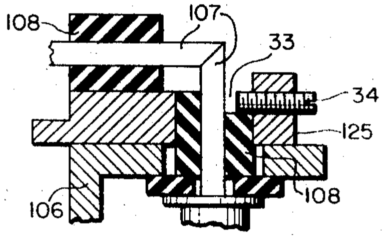
FIG. 5 is a partial longitudinal section showing a modification of the structure of FIG. 2 to make the circuit of FIG. 4.

In FIG. 5 which is a portion of FIG. 2, the capacitor 33 is incorporated by means of a tuning screw 34 threadedly engaged in the coupling housing 125.

If, as is mentioned above, the input filter coupling path between points C and D is tuned to quarter-wave resonance at the output frquency $f_o$, then the additional output signal decoupling scheme shown in FIG. 4 can be incorporated as shown in FIG. 6. the bypass capacitor 18 and trimming capacitor 19 are substantially coincident, and for convenience only the latter is illustrated. The decoupling scheme is otherwise the same as in FIG. 4.

While the invention has been described in relation to specific embodiments, various modifications thereof will be apparent to those skilled in the art and it is intended to cover the invention broadly within the spirit and scope of the appended claims.

We claim:

1. An electric wave frequency changer for providing in the presence of an input wave at a frequency $f_i$ an output wave at a different frequency $f_o$ comprising a band-pass filter having in a single hollow electrically conductive structure input coupling means followed by a plurality of intercoupled resonators and output coupling means, the pass-band of said filter including $f_o$ but not $f_i$, said filter being of the variety in which said coupling means and resonators are each in a form including a section of transmission line which is normally directly grounded at one end to said structure, characterized by the transmission line section of said input means having two members extending toward each other across the interior of said structure, a first of said members being directly grounded to said structure, the second of said members being separated physically by a dielectric body from said structure, said dielectric body being the dielectric of a capacitor for bypassing to said structure wave energy at the frequency $f_o$, a voltage-variable nonlinear impedance device coupled between said first and second members of said transmission line section of said input coupling means, means including said capacitor having said dielectric body to tune said input coupling means to resonance at the frequency $f_o$ of said output wave, an input circuit providing a wave path and means for tuning said path substantially to resonance at the frequency $f_i$ of said input wave, said input circuit wave path having parts outside said structure connected to said second member and said wave path thereby including inside said structure said nonlinear impedance device and said transmission line section and said capacitor having said dielectric body as parts of said input circuit so that the input frquency $f_i$ is applied to said device as an element of said input circuit.

2. Frequency changer according to claim 1 in which said input circuit wave path includes in series a transmission line section outside said structure, and said device and input coupling means transmission line section inside said structure.

3. Frequency changer according to claim 2 in which said input circuit wave path is tuned to half-wave resonance.

4. Frequency changer according to claim 1 in which said input coupling means defines an output wave path for said output wave, and capacitor means are provided between the ends of said output wave path for coupling said ends together at the output frequency $f_o$.

5. Frequency changer according to claim 1 in which said device is a voltage-variable nonlinear capacitance semiconductor diode.

6. Frequency changer according to claim 1 including an electrically conductive enclosure for said structure, in which said input coupling means comprises a first electrical conductor connected at one end to said enclosure and at the other end to a first electrode of said device and a second electrical conductor connected at one end to a second electrode of said device and the other end connected to the input for said input wave, said second conductor passing through said enclosure making no direct electrical contact therewith.

7. Frequency changer according to claim 6 including a bypass capacitor for the output frequency $f_o$ connected between said second electrical conductor and said enclosure.

8. Frequency changer according to claim 7 in which the portion of said input wave path outside said enclosure comprises a section of transmission line having one conductor coupled to said second electrical conductor and another conductor connected to said enclosure.

9. Frequency changer according to claim 1 in which $f_o = nf_i$ where "$n$" is an integer, and said device is a volt age-variable nonlinear capacitance semiconductor diode for generating harmonics of $f_i$, said filter having a band-pass which substantially excludes $(n-1)\ f_i$ and $(n+1)\ f_i$.

10. An electric wave frequency multiplier for providing in response to an input wave at a frequency $f_i$ an output wave at a frequency $f_o$ which is $nf_i$ where "$n$" is an integer, comprising in a single hollow electrically conductive structure a band-pass filter the pass-band of which includes $f_o$ and substantially excludes $(n+1)\ f_i$ and $(n-1)\ f_i$, variable impedance device for generating harmonics at a wave impressed upon it, an input circuit providing a wave path for said input wave and means for tuning said path substantially to resonance at $f_i$, said device coupled to said path in a region substantially adjacent one end thereof, said band-pass filter having input coupling means including a section of transmission line within said structure which is in two parts, said device being coupled between said parts, means at one end of said section to apply a signal $f_i$, and capacitive means having a dielectric body between said end of said section and said structure for tuning said section substantially to resonance at $f_o$.

11. Frequency changer according to claim 4 including further capacitor means coupled across the input circuit spaced one-quarter wavelength at the input frequency from the output wave path for substantially decoupling output wave energy from the input circuit.

12. Frequency changer according to claim 11 in which said output wave path is tuned substantially to half-wave resonance at the output frequency.

13. Frequency changer according to claim 11 in which said output wave path is tuned substantially to quarter-wave resonance at the output frequency.

References Cited

UNITED STATES PATENTS

| | | | |
|---|---|---|---|
| 3,381,207 | 4/1968 | Guthrie | 321—69 |
| 2,954,468 | 9/1960 | Matthaei. | |
| 3,194,976 | 7/1965 | Ludwig et al. | 307—88.5 |
| 3,311,812 | 3/1967 | Geiszler et al. | 321—69 |

JOHN F. COUCH, *Primary Examiner.*

G. GOLDBERG, *Assistant Examiner.*

U.S. Cl. X.R.

333—76